US009333460B2

(12) United States Patent
Radoiu

(10) Patent No.: US 9,333,460 B2
(45) Date of Patent: May 10, 2016

(54) PLASMA TREATMENT DEVICE

(75) Inventor: Marilena Radoiu, Nailsea (GB)

(73) Assignee: Edwards Limited, Crawley, West Sussex (GB)

( * ) Notice: Subject to any disclaimer, the term of this patent is extended or adjusted under 35 U.S.C. 154(b) by 2165 days.

(21) Appl. No.: 12/084,360

(22) PCT Filed: Sep. 21, 2006

(86) PCT No.: PCT/GB2006/003489
§ 371 (c)(1),
(2), (4) Date: Apr. 1, 2009

(87) PCT Pub. No.: WO2007/048993
PCT Pub. Date: May 3, 2007

(65) Prior Publication Data
US 2009/0183684 A1    Jul. 23, 2009

(30) Foreign Application Priority Data
Oct. 28, 2005    (GB) .................................. 0522088.4

(51) Int. Cl.
*B01D 53/32* (2006.01)
*C23C 16/511* (2006.01)
(Continued)

(52) U.S. Cl.
CPC ............... *B01D 53/32* (2013.01); *A62D 3/178* (2013.01); *A62D 3/38* (2013.01); *B01J 19/126* (2013.01); *C23C 16/4412* (2013.01); *C23C 16/511* (2013.01); *H05H 1/24* (2013.01);
(Continued)

(58) Field of Classification Search
CPC ... B01J 19/126; A62D 3/178; A62D 2203/04; A62D 3/38; A62D 2101/22; C23C 16/4412; C23C 16/511

USPC .......... 588/310, 301, 311, 400; 118/723 MW, 118/723 ME; 156/345.35, 345.41, 345.36
See application file for complete search history.

(56) References Cited

U.S. PATENT DOCUMENTS

| 2,710,878 A | 6/1955 | Glasebrook |
| 5,137,701 A * | 8/1992 | Mundt .................. B01D 53/00 204/157.3 |

(Continued)

FOREIGN PATENT DOCUMENTS

| GB | 2 273 027 A | 6/1994 |
| GB | 2 316 170 A | 2/1998 |

(Continued)

OTHER PUBLICATIONS

Anonymous; "Stainless Steel—Corrosion Resistance," Internet Article, Aug. 9, 2005, XP002409417 retrieved from the internet: URL:http://web.archive.org/web/20050809082044/http://www.azom.com/details.asp?articleID=1177 [retrieved on Nov. 27, 2006]; Retrieved from web archive, date of archival Sep. 8, 2005; p. 1, paragraph 2.

(Continued)

*Primary Examiner* — Rudy Zervigon
(74) *Attorney, Agent, or Firm* — Westman, Champlin & Koehler, P.A.

(57) ABSTRACT

A plasma abatement device comprises a gas chamber having a gas inlet for receiving a gas to be treated by the device and a gas outlet, at least part of the inner surface of the gas chamber being formed from, or coated with, an electrically conductive material that is resistant to corrosion during treatment of a gas containing a halocompound and water vapor.

7 Claims, 5 Drawing Sheets

(51) Int. Cl.
*B01J 19/12* (2006.01)
*A62D 3/178* (2007.01)
*A62D 3/38* (2007.01)
*C23C 16/44* (2006.01)
*H05H 1/24* (2006.01)
*H05H 1/46* (2006.01)

(52) U.S. Cl.
CPC ........... *H05H 1/46* (2013.01); *B01D 2257/204* (2013.01); *B01D 2257/206* (2013.01); *B01D 2258/0216* (2013.01); *B01D 2259/818* (2013.01); *H05H 2001/4622* (2013.01); *H05H 2001/4697* (2013.01); *H05H 2245/121* (2013.01)

(56) References Cited

U.S. PATENT DOCUMENTS

| | | | | |
|---|---|---|---|---|
| 5,342,472 | A | | 8/1994 | Imahashi et al. |
| 5,451,259 | A | * | 9/1995 | Krogh .................... B01J 12/002 118/723 MR |
| 5,453,125 | A | * | 9/1995 | Krogh .................... B01J 12/002 118/723 MA |
| 5,663,476 | A | * | 9/1997 | Cripe ..................... B01D 53/54 422/170 |
| 6,045,618 | A | * | 4/2000 | Raoux .................... B01D 45/06 118/715 |
| 6,110,556 | A | * | 8/2000 | Bang ..................... C23C 16/455 118/715 |
| 6,187,072 | B1 | * | 2/2001 | Cheung .................. B01D 45/06 118/715 |
| 6,193,802 | B1 | * | 2/2001 | Pang ..................... B01D 45/06 118/715 |
| 6,230,652 | B1 | * | 5/2001 | Tanaka ................... C23C 16/511 118/723 ME |
| 6,271,148 | B1 | * | 8/2001 | Kao ..................... C23C 16/4405 216/69 |
| 6,391,146 | B1 | * | 5/2002 | Bhatnagar ............... B01D 53/34 118/715 |
| 7,497,922 | B2 | * | 3/2009 | Kumar ................... B01J 19/088 156/345.41 |
| 2003/0000823 | A1 | | 1/2003 | Uhm et al. |
| 2009/0165953 | A1 | * | 7/2009 | Seeley .................. B01D 53/007 156/345.41 |
| 2009/0183684 | A1 | * | 7/2009 | Radoiu .................. B01D 53/32 118/726 |

FOREIGN PATENT DOCUMENTS

| | | |
|---|---|---|
| JP | H05190501 A | 7/1993 |
| JP | H09196773 A | 7/1997 |
| JP | H10284299 A | 10/1998 |
| JP | 2003321760 | 11/2003 |
| JP | 2004313998 A | 11/2004 |
| TW | 288251 B | 10/1996 |
| TW | 451286 B | 8/2001 |
| TW | I400010 B | 6/2013 |
| WO | WO 96/13621 | 5/1996 |
| WO | WO 01/08783 A2 | 2/2001 |
| WO | WO 2004/098246 A1 | 11/2004 |

OTHER PUBLICATIONS

United Kingdom Search Report of Application No. GB 0522088.4 mailed Feb. 20, 2006; Date of search: Feb. 17, 2006.

PCT Notification of Transmittal of the International Search Report and the Written Opinion of the International Searching Authority, or the Declaration of International Application No. PCT/GB2006/003489; Date of mailing: Jul. 2, 2007.

PCT International Search Report of International Application No. PCT/GB2006/003489; Date of mailing of the International Search Report: Jul. 2, 2007.

PCT Written Opinion of the International Searching Authority of International Application No. PCT/GB2006/003489; Date of mailing: Jul. 2, 2007.

Prosecution history for corresponding Chinese Application No. 200680040226.8 including: First Office Action dated Jan. 29, 2010; Second Office Action dated Aug. 17, 2010; Response dated Oct. 28, 2010 and Third Office Action dated Jan. 31, 2011.

Prosecution history for corresponding European Application No. 06779493.3-2113 including: Communication dated Jul. 14, 2009; Response dated May 15, 2010; Communication dated Jun. 18, 2010 and Response dated Oct. 20, 2010.

Prosecution history for corresponding Japanese Application No. 2008-537167 including: Notification of Reason for Rejection dated Oct. 31, 2011.

Prosecution history for corresponding Korean Application No. 2008/7010056 including: Reasons for Rejection dated Nov. 9, 2012 and Response dated Mar. 20, 2013.

Prosecution history for corresponding Taiwanese Application No. 095136268 including: Office Action dated Dec. 5, 2012; Search Report dated Nov. 13, 2012 and response dated May 28, 2013.

* cited by examiner

PLASMA TREATMENT DEVICE

FIELD OF THE INVENTION

The present invention relates to a plasma abatement device. The invention is particularly suitable to a plasma abatement device for treating a gas stream exhaust from a polysilicon etch process.

BACKGROUND OF THE INVENTION

During the formation of a semiconductor or flat panel display device, various different process gases are supplied to various process chambers. Chemical vapour deposition (CVD) is used to deposit thin films or layers on the surface of a substrate or wafer located in a deposition chamber. This process operates by supplying one or more reactive gases to the chamber, often using a carrier gas, to the substrate's surface under conditions that encourage chemical reactions to take place at the surface. For example, TEOS and one of oxygen and ozone may be supplied to the deposition chamber for the formation of a silicon oxide layer on the substrate, and silane and ammonia may be supplied for the formation of a silicon nitride layer. Polycrystalline silicon, or polysilicon, is deposited on the substrate by the decomposition of silane or a chlorosilane by heat.

Gases are also supplied to an etch chamber to perform selective etching of areas of the deposited layers, for example during the formation of electrodes and the source and drain regions of a semiconductor device. Etching gases can include the perfluorocompounds such as $CF_4$, $CHF_3$ and $NF_3$, other halocompounds such as HCl, HBr, $BCl_3$, $Cl_2$ and $Br_2$, and combinations thereof. For example, $CF_4$ is commonly used to initially form an opening in a region of a nitride or oxide layer formed over a polysilicon layer and which is exposed by a photoresist layer, and a mixture of HBr and $Cl_2$ is commonly used to subsequently etch the exposed polysilicon.

The etching gases can react with a photoresist to form deposits and tars that need to be periodically removed from the etch chamber, and so a cleaning gas, typically comprising $SF_6$ and oxygen, is periodically supplied to the etch chamber to remove the unwanted material from the chamber.

During these etch and cleaning processes performed within the etch chamber, there is typically a residual amount of the gas supplied to the etch chamber contained in the gas exhausted from the etch chamber. Perfluorocompounds such as $CF_4$ and $SF_6$ are greenhouse gases, and an abatement device is often provided to treat the exhaust gas before it is vented to the atmosphere. The abatement device converts the more hazardous components of the exhaust gas into species that can be readily removed from the exhaust gas, for example by conventional scrubbing, and/or can be safely exhausted to the atmosphere.

Perfluorocompounds (PFCs) such as $CF_4$, $SF_6$, $NF_3$ and $C_2F_6$ can be removed from the gas stream with high efficiency using a microwave plasma abatement device. An example of a microwave plasma reactor is described in UK Patent no. GB 2,273,027. In that device, a waveguide conveys microwave radiation from a microwave generator into a gas chamber housing two electrodes in a closely opposed relationship. A gas to be treated flows into the gas chamber through a gas inlet, and passes between the electrodes, so that a microwave plasma is initiated and sustained between the two electrodes from the gas flowing between the electrodes. One of the electrodes has an axial hole to provide a gas outlet from the gas chamber. Under the intensive conditions within the plasma, species within the gas stream are subjected to impact with energetic electrons causing dissociation into reactive species that can combine with oxygen or hydrogen to produce relatively stable by-products.

A convenient source of oxygen and hydrogen for reacting with the various species contained in the gas stream is water vapour, which may be readily added to the gas stream upstream from the abatement device. For example, reaction of $CF_4$ with water vapour will form $CO_2$ and HF, and $Cl_2$ can form HCl within the chamber. HF, HCl and HBr can be subsequently removed from the gas stream by a wet scrubber located downstream from the abatement device.

Various parts of a plasma abatement device, such as one or more of the electrodes, electrode holders and the inner surface of the chamber, are typically formed from stainless steel. In addition to iron, carbon, and chromium, stainless steel may also contain other elements, such as nickel, molybdenum, niobium and titanium. In the presence of air, a passive surface oxide layer is formed, which protects the underlying stainless steel from corrosion. However, in the presence of acidic gases such as HF, HCl, and HBr, the passive layer can be stripped, exposing the underlying stainless steel. For example, HF may be present in the gas chamber as a by-product of the treatment of a perfluorocompound within the gas chamber, and HCl or HBr may be contained in the gas exhaust from the process chamber during an etching process.

Once the nickel oxide layer has been removed, HBr, and HCl can react with the metals contained in the stainless steel when moisture levels are in excess of a few parts per million (ppm). Due to the water adsorbed on the stainless steel surface, the by-products of these reactions can degrade the gas chamber and the electrodes, which can reduce the efficiency of the abatement device.

It is an aim of at least the preferred embodiment of the present invention to provide an improved plasma abatement device that is suitable for treating a gas stream containing varying amounts of a halocompound, such as HBr, HCl, $Br_2$ or $Cl_2$, and water vapour.

SUMMARY OF THE INVENTION

The present invention provides a plasma abatement device comprising a gas chamber having a gas inlet for receiving a gas to be treated by the device and a gas outlet, at least part of the inner surface of the gas chamber being formed from, or coated with, an electrically conductive material that is resistant to corrosion during treatment of a gas containing a halocompound and water vapour.

The present invention also provides a plasma abatement device comprising a gas chamber having a gas inlet for receiving a gas to be treated by the device and a gas outlet, at least part of the inner surface of the gas chamber being formed from, or coated with, titanium.

The present invention also provides a microwave plasma abatement device comprising a microwave resonant cavity having a gas inlet and a gas outlet, and a waveguide for conveying microwave radiation to the resonant cavity, the resonant cavity having an inner surface formed from, or coated with, titanium.

BRIEF DESCRIPTION OF THE DRAWINGS

Preferred features of the present invention will now be described, by way of example only, with reference to the accompanying drawings, in which.

DETAILED DESCRIPTION OF THE INVENTION

Figure 1:
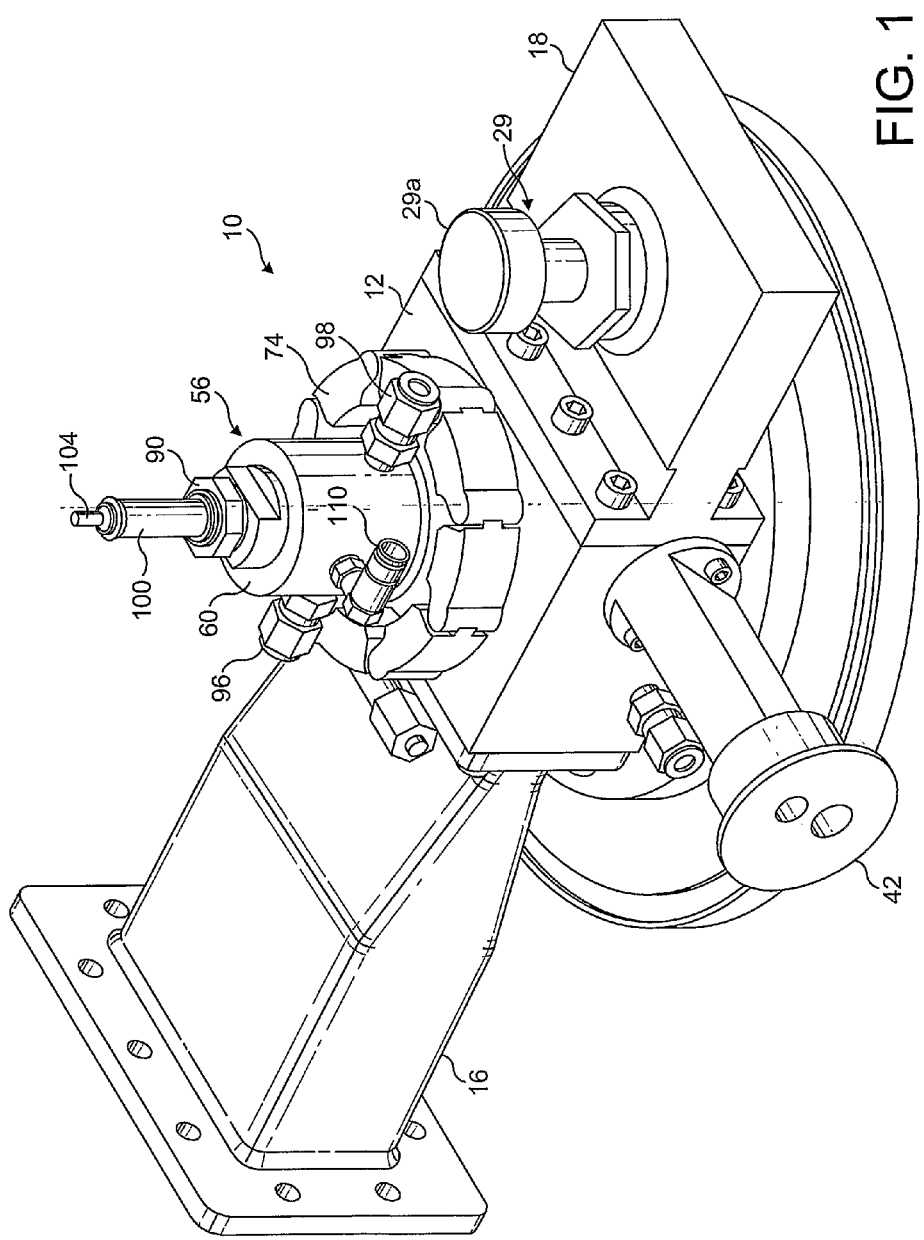
FIG. 1 is an external perspective view of a microwave plasma abatement device.

In a first aspect, the present invention provides a plasma abatement device comprising a gas chamber having a gas inlet for receiving a gas to be treated by the device and a gas outlet, at least part of the inner surface of the gas chamber being formed from, or coated with, an electrically conductive material that is resistant to corrosion during treatment of a gas containing a halocompound and water vapour.

The inner surface of the gas chamber may comprise a layer of said electrically conductive material formed on the inner surface of a housing defining, at least in part, the gas chamber. For example, the housing may be formed from a stainless steel body having an inner surface coated with said electrically conductive material. Alternatively, the gas chamber may be defined at least in part by a housing formed from said electrically conductive material.

One example of a suitable material is titanium. It has been observed that titanium exhibits remarkable corrosion resistance in oxidising acid environments. The strong oxidising nature of moist halogens creates a passive surface oxide layer on titanium, which protects the underlying titanium material when the chamber is exposed to a humid atmosphere containing gases having the general formulae HX or $X_2$ where X is a halogen such as F, Cl or Br.

In the preferred embodiment, the plasma abatement device comprises a microwave plasma abatement device, but the invention may also be applicable to other types of plasma abatement device, for example a plasma torch abatement device, which may have stainless steel electrodes and/or a stainless steel gas chamber coated with said electrically conducting material. The gas is preferably treated at or around atmospheric pressure by the abatement device.

The electrically conductive material may be diamagnetic or paramagnetic. The weaker the magnetic susceptibility of the material, the greater the transparency of the material to a magnetic field established within the gas chamber, for example when the device is a microwave plasma abatement device. Consequently, the use of diamagnetic materials such as brass, gold and silver, and paramagnetic materials such as titanium and aluminium which have a relatively low magnetic susceptibility in comparison to superparamagnetic materials and ferromagnetic materials, such as steel and nickel, will result in less distortion of the flux lines of the magnetic field established within the gas chamber, and enhance the quality of a plasma generated within the gas chamber.

The gas chamber may be located, at least in part, within a resonant cavity of the device. Forming the inner walls of the resonant cavity with a material such as titanium can provide reduced conductor losses in comparison to a resonant cavity formed from stainless steel or Inconel. The interaction of electromagnetic radiation at the metallic surfaces of the resonant cavity gives rise to a flow of current, and therefore power losses which manifest as conductor losses. The power dissipated within the walls of the cavity is directly related to the skin depth of the material from which the walls are formed; the higher the skin depth, the greater the power dissipation within the walls and so the lower the amount of power available for gas abatement. As titanium has a smaller skin depth (around 7.5 microns) than stainless steel (around 8.6 microns) and Inconel (around 11.4 microns), the destruction and removal efficiency of the device may thus be improved by the use of titanium for at least the inner walls of the resonant cavity. Consequently, the electrically conductive material preferably has a skin depth less than 8 microns.

In a second aspect, the present invention provides a plasma abatement device comprising a gas chamber having a gas inlet for receiving a gas to be treated by the device and a gas outlet, at least part of the inner surface of the gas chamber being formed from, or coated with, titanium.

In a third aspect, the present invention provides a microwave plasma abatement device comprising a microwave resonant cavity having a gas inlet and a gas outlet, and a waveguide for conveying microwave radiation to the resonant cavity, the resonant cavity having an inner surface formed from, or coated with, an electrically conductive material that is resistant to corrosion during treatment of a gas containing a halocompound and water vapour.

In a fourth aspect, the present invention provides a microwave plasma abatement device comprising a microwave resonant cavity having a gas inlet and a gas outlet, and a waveguide for conveying microwave radiation to the resonant cavity, the resonant cavity having an inner surface formed from, or coated with, titanium.

Features described above in relation to the first aspect are equally applicable to the second to fourth aspects, and vice versa.

With reference to FIGS. 1 to 4, a microwave plasma abatement device 10 comprises an electrically conductive housing 12. As illustrated, the housing 12 may have a rectangular cross-section. A slot 14 is formed in the housing 12, for example by machining, and extends across the width of the housing 12 to provide a resonant cavity of the abatement device 10. One end of the resonant cavity 14 is connected to a waveguide 16 for conveying microwave radiation from a microwave generator (not shown) into the resonant cavity 14. The other end of the resonant cavity 14 is connected to a short circuit 18.

The waveguide 16 comprises a first, substantially rectangular body portion 20 having a height $h_1$ substantially parallel to the $TE_{01}$ electric field of the microwave radiation conveyed through the waveguide 16 to the resonant cavity 14, and a width w orthogonal to the electric field of the microwave radiation. The waveguide 16 also comprises a second, substantially rectangular body portion 22 facing the resonant cavity 14, the second body portion 22 having a height $h_2$ and a width w, where $h_2 < h_1$. In the illustrated example, the second body portion 22 has a height of approximately one third of the height of the first body portion 20.

The waveguide 16 further comprises a tapered, convergent portion 24 of width w located between the first and second body portions 20, 22. The tapered portion 24 comprises a first end surface 25a adjacent the first body portion 20 of height $h_1$ and width w, and a second end surface 25b adjacent the second body portion 22 of height $h_2$ and width w. The tapered portion 24 further comprises first and second side surfaces 25c, 25d extending between the end surfaces 25a, 25b and inclined at an acute angle to the second side surface 25b such that the first and second body portions 20, 22 are co-axial. The tapered portion 24 has a length/in the direction of propagation of the microwave radiation through the waveguide 16, where/ is equal to approximately one half of the wavelength of the microwave radiation.

The short circuit 18 provides an extension of the waveguide 16 on the opposite side of the resonant cavity 14. The short circuit 18 comprises a chamber 27 defined in part by an end plate 26 that is distanced from the end of the second portion 22 of the waveguide 16 such that the incident microwave radiation is reflected by the end plate 26 to form an electromagnetic standing wave within the resonant cavity 14. The position of the end plate 26 relative to the end of the second portion 22 of the waveguide 16 may be adjustable.

The short circuit 18 comprises a tuner 29 spaced from the end plate 26 for tuning the short circuit 18. In the illustrated example, the tuner comprises a screw 29 threaded into the top surface of the short circuit 18 such that the body of the screw extends into the chamber 27 substantially perpendicular to the direction of propagation of the microwave radiation through the chamber 27. By turning the head 29*a* of the screw 29, the end of the screw 29 can be raised or lowered within the chamber 27 to tune the short circuit 18.

The resonant cavity 14 houses two dielectric plate members 28, 30, preferably formed from PTFE or other suitable material for retaining adequate corrosion resistance whilst being substantially transparent to the microwave radiation conveyed through the resonant cavity 14. Each plate member 28, 30 has a flat sidewall portion 32 extending orthogonally to the direction of propagation of the microwave radiation through the resonant cavity 14, and a curved sidewall portion 34 which define in part a substantially cylindrical gas chamber 36 within the resonant cavity 14. The gas chamber 36 may have a circular or elliptical cross-section.

Each plate member 30, 32 has a first bore 38 formed therein providing a gas inlet into the gas chamber 36 of the resonant cavity 14. In the illustrated abatement device 10, one of the bores 38 is aligned with a gas inlet port 40 formed in a sidewall of the housing 12 for receiving gas from a first gas conduit 42 mounted on the housing 12. A second gas port may optionally be formed in the opposite sidewall of the housing 12 for receiving gas from a second gas conduit, which gas may be the same as, or dissimilar to, the gas entering the gas chamber 36 from the first gas conduit 42. Each gas inlet is preferably configured so that gas enters the gas chamber 36 from the first gas conduit 40 substantially tangentially, so that the gas swirls inwardly within the gas chamber 36 towards the centre of the gas chamber 36. A gas outlet port 44 is formed in the base of the housing 12 for conveying gas from the gas chamber 36 to a second gas conduit 46. The gas outlet port 44 extends transversely of, and is preferably co-axial with, the gas chamber 36.

Each plate member 30, 32 also has a smaller second bore 48 formed therein. One of the bores 48 is aligned with an aperture 50 formed in a sidewall of the housing and closed by a transparent cover plate 52 to provide an inspection window for enabling a user to observe a plasma generated within the gas chamber 36 of the resonant cavity 14 during use of the abatement device 10.

A cylindrical bore 54 is also formed in the housing 12, the bore 54 extending transversely of the resonant cavity 14 and defining with the resonant cavity a gas chamber of the abatement device 10. The bore 54 is preferably substantially co-axial with the gas chamber 36 and gas outlet port 44. The bore 54 receives an electrically conducting assembly 56. The assembly 56 comprises an electrically conducting member 58 and a holder 60 for holding the electrically conducting member 58.

Figure 5:
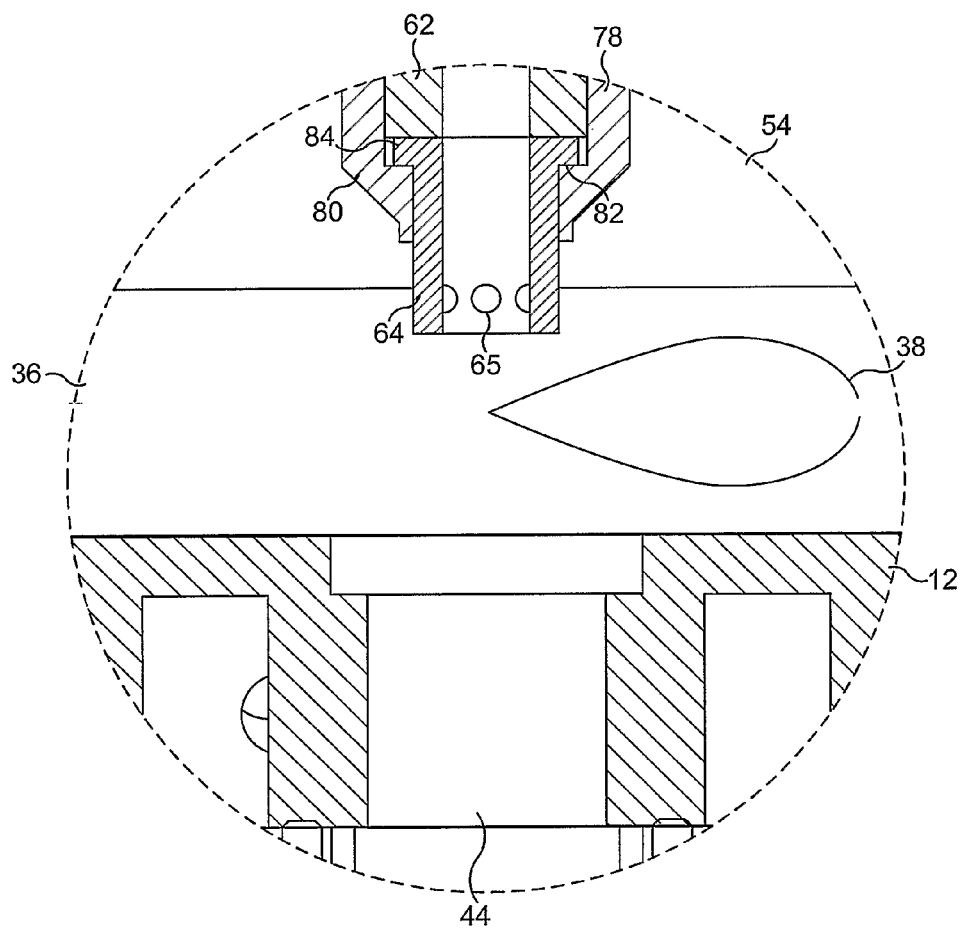
FIG. 5 is an enlarged view of region C identified in FIG. 3.

The electrically conducting member 58 comprises an elongate tube 62, which may be formed from copper or other electrically conducting material, and which engages a tubular tip 64, as illustrated in more detail in FIG. 5. The tip 64 is preferably formed from corrosion and heat resistant material, such as tungsten or a tungsten alloy, for example an alloy of tungsten and lanthanum. The tip 64 may be provided with a plurality of apertures 65 extending thereabout to enable a gas flowing between the gas inlet 38 and the gas outlet 44 to pass radially through the tip 64 and thereby enhance the cooling of the tip 64. The apertures 65 are preferably dimensioned so that microwave radiation passes through the apertures 65.

Figure 3:
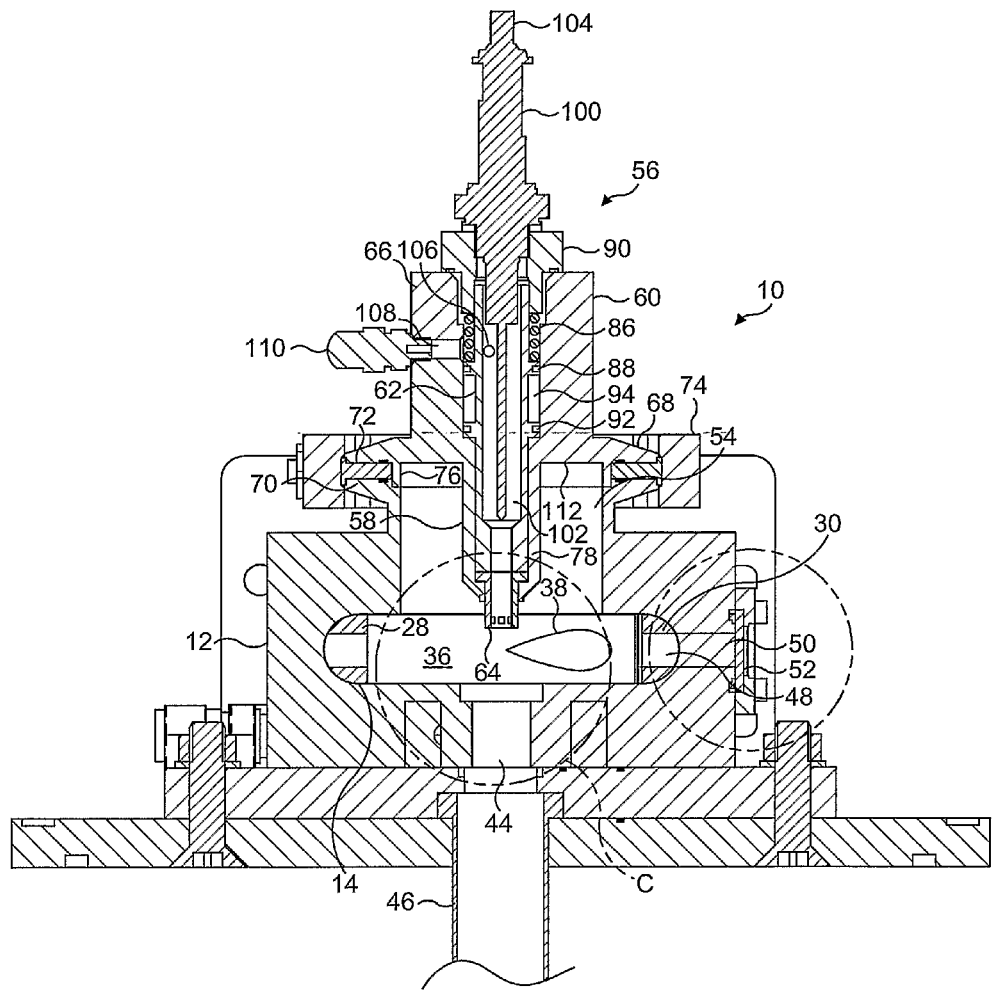
FIG. 3 is a cross-sectional view through the device along line A-A of FIG. 2.
Figure 4:
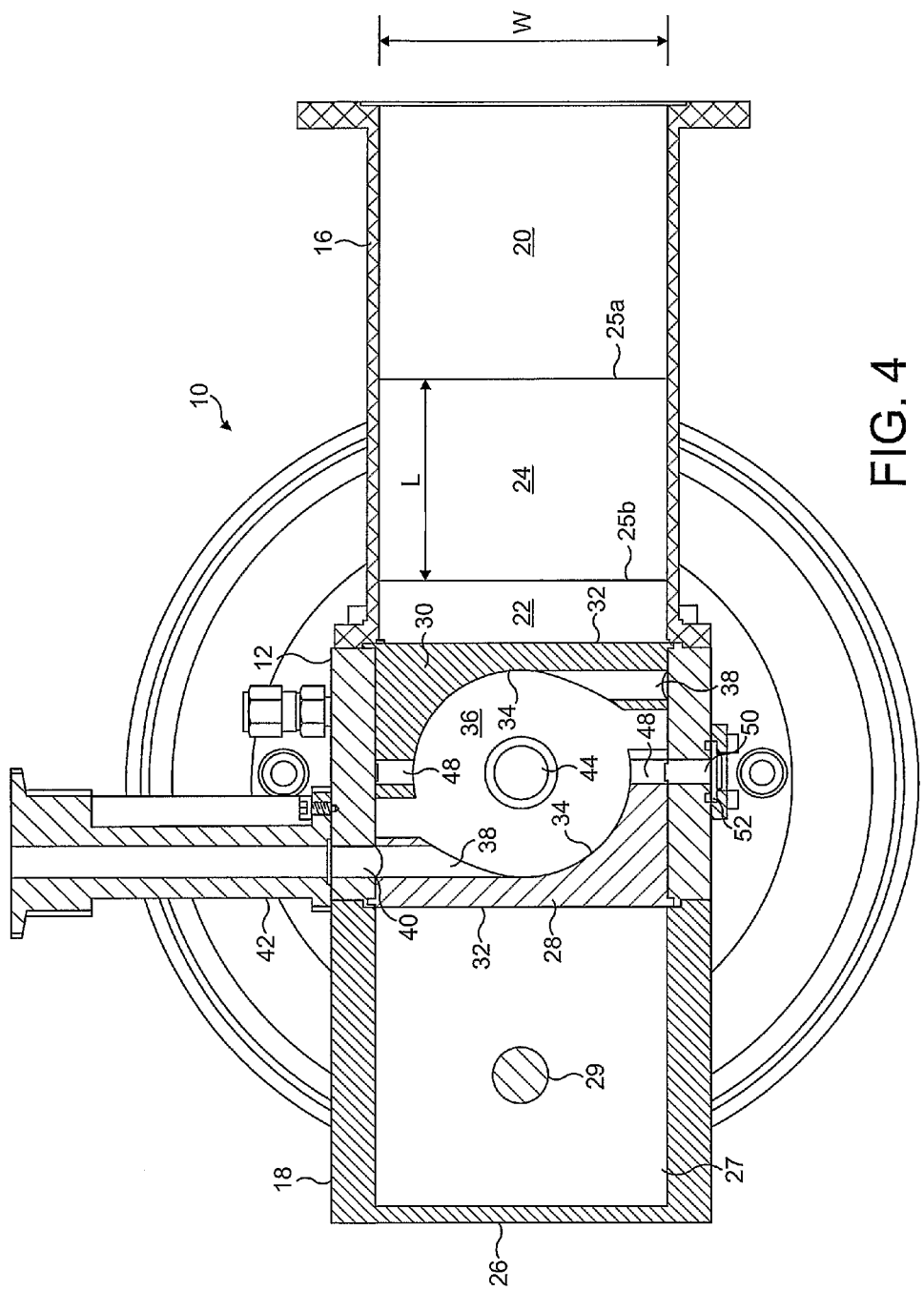
FIG. 4 is a cross-sectional view through the device along line B-B of FIG. 2.

The holder 60 is also preferably formed from electrically conducting material. The electrically conducting member 58 and holder 60 are preferably at electrical ground during use of the abatement device 10. The holder 60 has a hollow interior within which the tube 62 and tip 64 of the electrically conducting member 58 are preferably a sliding fit. The holder 60 comprises a first body portion 66 having an outwardly extending skirt 68, which is located on a flanged opening 70 of the bore 54 of the housing 12. An O-ring 72 is provided between the skirt 68 and the flanged opening 70 to form an air-tight seal, the skirt 68 being clamped to the flanged opening 70 by a clamp chain 74 extending thereabout. As illustrated in FIG. 3, the O-ring 72 is preferably located outside of the gas chamber and therefore outside of the electromagnetic field generated therein, and may extend about an annular ring 76 depending downwardly from the skirt 68, the annular ring having an inner diameter that is substantially equal to the diameter of the bore 54, and which makes electrical contact with the housing 12. Alternatively, the base of the skirt 68 may make electrical contact with the housing 12.

The holder 60 further comprises a second, elongate body portion 78 that extends into the bore 54. The second body portion 78 of the holder 60 terminates with a conical projection 80, which preferably does not protrude into the gas chamber 36. The internal diameter of the second body portion 78 decreases at the conical projection 80 to provide a shoulder 82 that engages a rim 84 of the tip 64 to retain the tip 64 within the holder 60. The second body portion 78 of the holder 60 is preferably integral with both the first body portion 66 and the skirt 68.

As illustrated in FIG. 5, the tip 64 preferably protrudes into the gas chamber 36. The length of the tip 64, and/or the length of the second body portion 78 of the holder 60, is preferably chosen so that the tip 64 extends a predetermined distance into the standing wave generated within the resonant cavity 14 depending on the frequency of the microwave radiation supplied to the resonant cavity 14.

The tube 62 is preferably held in electrical contact with the holder 60. As illustrated, a metal spring 86 or other electrically conducting item, may be located within the holder 60 such that one end of the spring 86 engages a first annular projection 88 formed on the tube 62 and the other end of the spring 86 engages a metallic lock nut 90 threaded into the holder 60.

The tube 62 has a second annular projection 92 spaced from the first annular projection 88 to define an annular channel 94 between the holder 60 and the tube 62. A flow of cooling water is supplied to the annular channel 94, the water being supplied to the annular channel 94 through a coolant inlet port 96 passing through the holder 60, and being exhausted from the annular channel 94 through a coolant outlet port 98 passing through the holder 60 and located substantially opposite the coolant inlet port 96.

Depending on the power of the electromagnetic radiation conveyed to the resonant cavity, the intensity of electric field created within the resonant cavity 14 may be insufficient to ignite a plasma within the gas chamber 36. Therefore, a glow-discharge electrode assembly 100 may be housed within the electrically conducting member 58. The electrode assembly 100 comprises a plasma-ignition, glow-discharge electrode 102, which is in the form of an elongate, high voltage electrode located concentrically within, but spaced from, the tube 62 of the electrically conducting member 58. A connector 104 connects the electrode 102 with a power supply. The electrode 102 may be threaded into a conformingly-threaded aperture located concentrically with the lock nut 90. A gas inlet 106 is formed within the tube 62 for receiving a flow of a glow-discharge gas, such as nitrogen, a noble gas, or any other substantially inert and ionisable gas, from a gas inlet port 108 extending radially through the first body portion 66 of the holder 60. The gas inlet port 108 receives the glow-discharge gas from a connector 110 attached to the holder for connecting the gas inlet port 108 to a source of the glow-discharge gas. The gas inlet 106 is preferably arranged tangentially with respect to the bore of the tube 62 of the electrically conducting member 58 to promote formation of a helical flow path around electrode 102 generally downwardly towards the tip 64 of the electrically conducting member 58.

Figure 2:
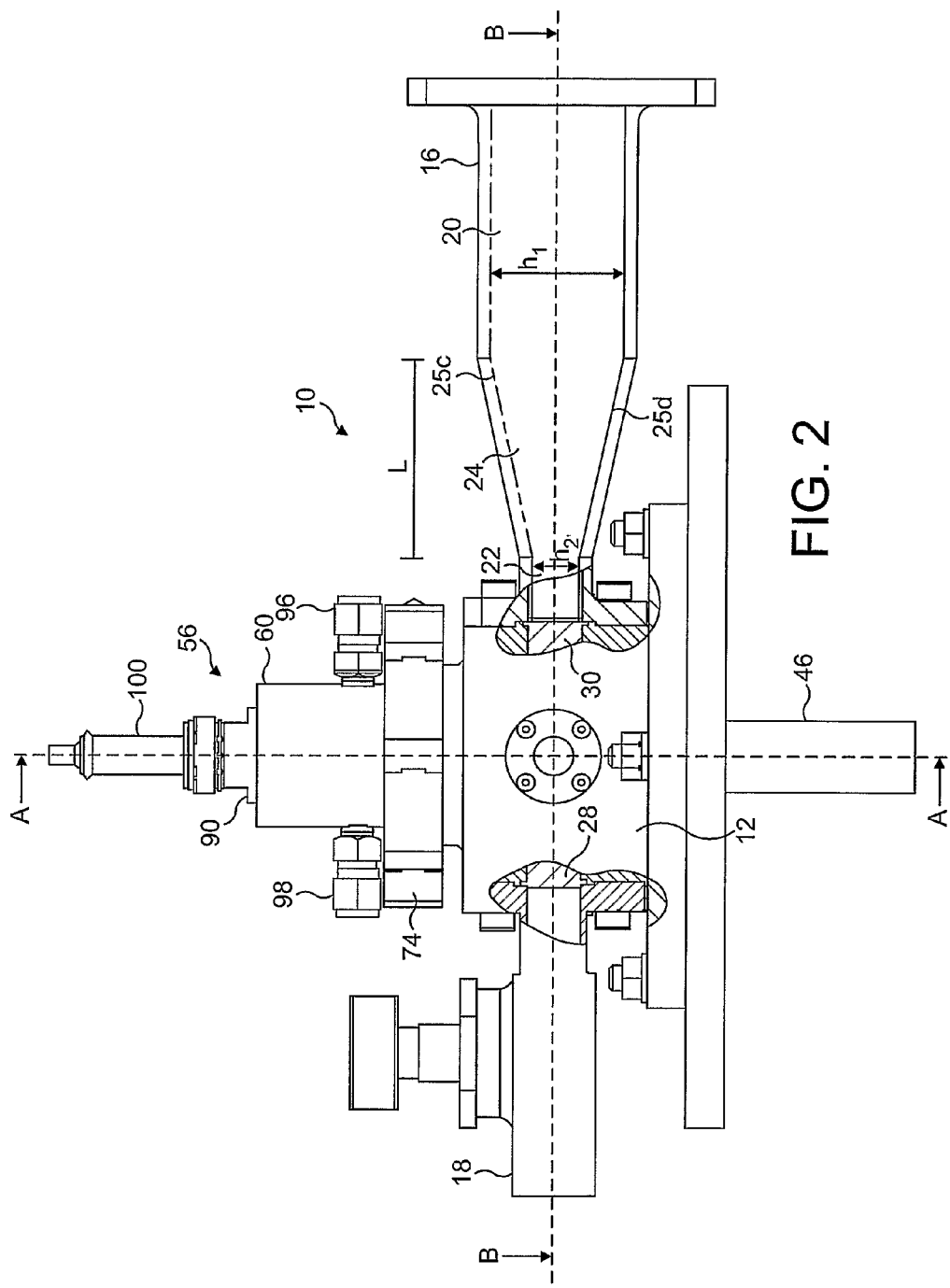
FIG. 2 is a side view of the device of FIG. 1.

As illustrated in FIG. 2, when the holder 60 is mounted on the housing 12, the electrically conducting member 58 extends into the bore 54 substantially perpendicular to the direction of propagation of the microwaves through the gas chamber 36, and is substantially co-axial with both the gas chamber 36 and the gas outlet port 44. The tip 64 of the electrically conducting member 58 is preferably located at a maximum intensity of the electromagnetic field formed within the resonant cavity 14 during use of the abatement device 10.

During normal use of the abatement device 10, a flow of cooling water is supplied to the annular channel 94. A gas is pumped into gas chamber 36 through the gas inlet port 40, flows spirally within the gas chamber 36 and passes beneath the tip 64 of the electrically conducting member 58 before leaving the gas chamber 36 through the gas outlet port 44 and entering the second gas conduit 46.

Microwave radiation is fed into the resonant cavity 14, and thus into the gas chamber 36, for a magnetron by the waveguide 16. The end plate 26 of the short circuit 18 reflects the microwaves to form a standing wave within the resonant cavity 14, with the tip 64 of the electrically conducting member 58 intensifying the electric field within the gas chamber 36. The tapered portion 24 of the waveguide 16 serves to inhibit the transmission and reflection of microwave radiation from the interface between the first and second body portions 20, 22 of the waveguide 16 whilst maximising the energy absorption of the plasma. The geometry and position of the lower surface 112 of the skirt 68 of the holder 60 relative to the tip 64 of the electrically conducting member 58 is chosen so that the lower surface 112 of the skirt 68 provides, with the inner surface of the bore 54 of the housing 12 and the outer surface of the second body portion of the holder 60, a co-axial tuner for matching the impedance in the plane of the electrically conducting member 58 to the impedance of the waveguide 16 at the frequency of the microwave radiation.

When a glows-discharge electrode assembly 100 is used to ignite a plasma within the gas chamber 36, the glow-discharge gas is caused to flow through the gas inlet port 106 of the tube 62 and into the bore of the tube 62. A low-voltage, high-current source is connected to the electrode 102, and a high voltage is applied temporarily to the electrode 102. The high voltage results in a corona discharge through the glow-discharge gas from the tip of the electrode 102 towards a proximal portion of the tube 62. That corona discharge provides a path through which a large current from the low voltage source can flow to ground. Flow of the large current causes formation of a glow discharge in the glow-discharge gas. The glow discharge thus formed is caused by the flow of the glow-discharge gas within the tube 62 to move from the tip 64 of the electrically conducting member 58 into the gas chamber 36. Microwave radiation within the gas chamber 36 is able to couple efficiently to the glow discharge and, in typically less than one second, the plasma ignites, leading to a stable microwave plasma which can be maintained by means of the microwave radiation supplied to the gas chamber 36 alone after the power supply to the electrode 102 is switched off (typically within two or three seconds).

The plasma initiated within the gas chamber 36 is carried out from the gas chamber 36 through the gas outlet port 44 with the gas flowing through the gas chamber 36, and is contained within the second gas conduit 46. The plasma thus resembles a flame generated beneath the tip 64 and extending out through the gas outlet port 44 into the second gas conduit 46. Due to the high temperature created within the second gas conduit 46 during use of the abatement device 10, a coolant such as water may be sprayed over the outer surface of the second gas conduit 46 to cool the second gas conduit 46.

Problems can arise when the exhaust gas contains gases such as HBr, HCl, $Br_2$ and $Cl_2$. HBr and HCl present in the chamber 36, together with HF generated as a by-product of a reaction occurring within the gas chamber 36, can strip the passive surface oxide layers from any stainless steel surfaces within the housing 12, exposing the stainless steel. Water vapour present within the exhaust gas entering the gas chamber 36 can adsorb on to the exposed stainless steel surfaces, and promote corrosion of these surfaces by the reaction of HBr, HCl, $Br_2$ or $Cl_2$ with metallic constituents of the stainless steel. As well as degrading the surfaces of these stainless steel components, the by-products from the corrosion can interfere with the microwaves entering the resonant cavity 14, and this can lead to a reduction in the destruction and removal efficiency of the gas treatment taking place within the gas chamber 36.

In view of this, when the gas entering the gas chamber 36 is likely to contain a halocompound such as HBr, HCl, $Br_2$ or $Cl_2$, either simultaneously with water vapour or separately therefrom, the inner surface of the housing 12, and preferably also other electrically conducting components of the device 10 such as the holder 60, are formed from, or coated with, an electrically conducting material that is resistant to corrosion during treatment of a gas containing such a halocompound and water vapour. The electrically conducting material is preferably paramagnetic or diamagnetic so as to not substantially interfere magnetically with the microwaves passing through the housing 12. One suitable example of the electrically conducting material is titanium, which forms a surface oxide that is resistant to stripping by the halocompound. The housing 12 and holder 60 may therefore be formed from titanium, or, more preferably, from another material such as stainless steel having a titanium layer formed on the inner surface thereof by any suitable technique.

While the foregoing description and drawings represent the preferred embodiments of the present invention, it will be apparent to those skilled in the art that various changes and modifications may be made therein without departing from the true spirit and scope of the present invention.

I claim:

1. A microwave plasma abatement device comprising a microwave resonant cavity having a gas inlet and a gas outlet, and a waveguide for conveying microwave radiation to the resonant cavity, the resonant cavity having an inner surface comprising an electrically conductive material resistant to corrosion induced by chemical reaction between a gas containing a halocompound and water vapour, wherein said electrically conductive material comprises titanium.

2. A device according to claim 1 wherein the inner surface of the cavity comprises a layer of said electrically conductive material formed on the inner surface of a housing defining, at least in part, the cavity.

3. A device according to claim 2 wherein the housing is formed from stainless steel.

4. A device according to claim 1 wherein the cavity is defined at least in part by a housing formed from said electrically conductive material.

5. A device according to claim 1 wherein said electrically conductive material is paramagnetic.

6. A device according to claim 1 wherein said electrically conductive material is diamagnetic.

7. A device according to claim 1 comprising an electrically conducting member protruding into the resonant cavity, the electrically conducting member comprising said electrically conductive material.

\* \* \* \* \*